United States Patent [19]

Lacombat et al.

[11] 4,295,735

[45] Oct. 20, 1981

[54] OPTICAL PROJECTION SYSTEM HAVING A PHOTOREPETITION FUNCTION

[75] Inventors: Michel Lacombat; André Gérard, both of Paris, France

[73] Assignee: Thomson-CSF, Paris, France

[21] Appl. No.: 124,743

[22] Filed: Feb. 26, 1980

[30] Foreign Application Priority Data

Feb. 27, 1979 [FR] France .................... 79 05008

[51] Int. Cl.³ ............... G03B 27/52; G03B 27/70
[52] U.S. Cl. ............... 355/43; 355/63; 355/66
[58] Field of Search ........ 355/53, 54, 43, 40, 355/62, 63, 60, 66, 77, 78, 86

[56] References Cited

U.S. PATENT DOCUMENTS

| | | |
|---|---|---|
| 3,323,414 | 6/1967 | Ritchie et al. ............... 355/43 X |
| 3,542,469 | 11/1970 | Hennings ............... 355/43 X |
| 3,718,396 | 2/1973 | Hennings ............... 355/43 |
| 3,853,398 | 12/1974 | Kano ............... 355/43 |
| 3,865,483 | 2/1975 | Wojcik ............... 355/43 |
| 3,917,399 | 11/1975 | Buzawa et al. ............... 355/43 |
| 4,059,355 | 11/1977 | Fritsch ............... 355/43 |
| 4,185,913 | 1/1980 | Ammann et al. ............... 355/43 |
| 4,215,934 | 8/1980 | Karasawa et al. ............... 355/60 X |

*Primary Examiner*—Richard A. Wintercorn
*Attorney, Agent, or Firm*—Oblon, Fisher, Spivak, McClelland & Maier

[57] ABSTRACT

An optical system for projecting patterns in order to reproduce the image of at least one modulating object on a mask or semiconductor wafer coated with photosensitive material for the fabrication of semiconductor components. In this system, optical reflecting means comprising one or a number of plane mirrors including at least one movable mirror are introduced in the optical path of the imaging objective. By forming additional optical paths, it is thus possible to associate with a photorepetition function different functions such as photocomposition or other photorepetition paths, or else to associate a device for ensuring alignment of the object-image planes and comprising optoelectronic detection means.

9 Claims, 6 Drawing Figures

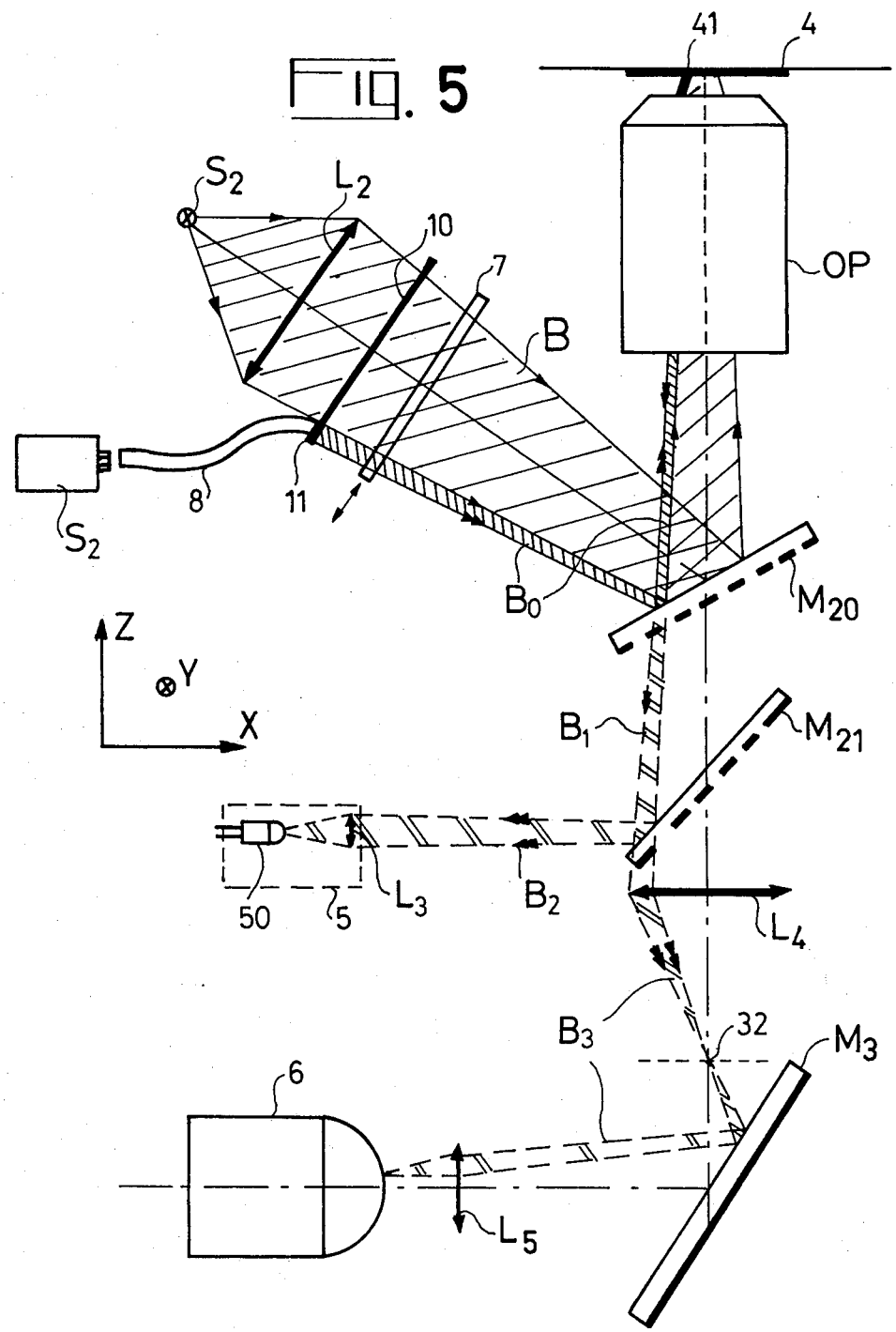

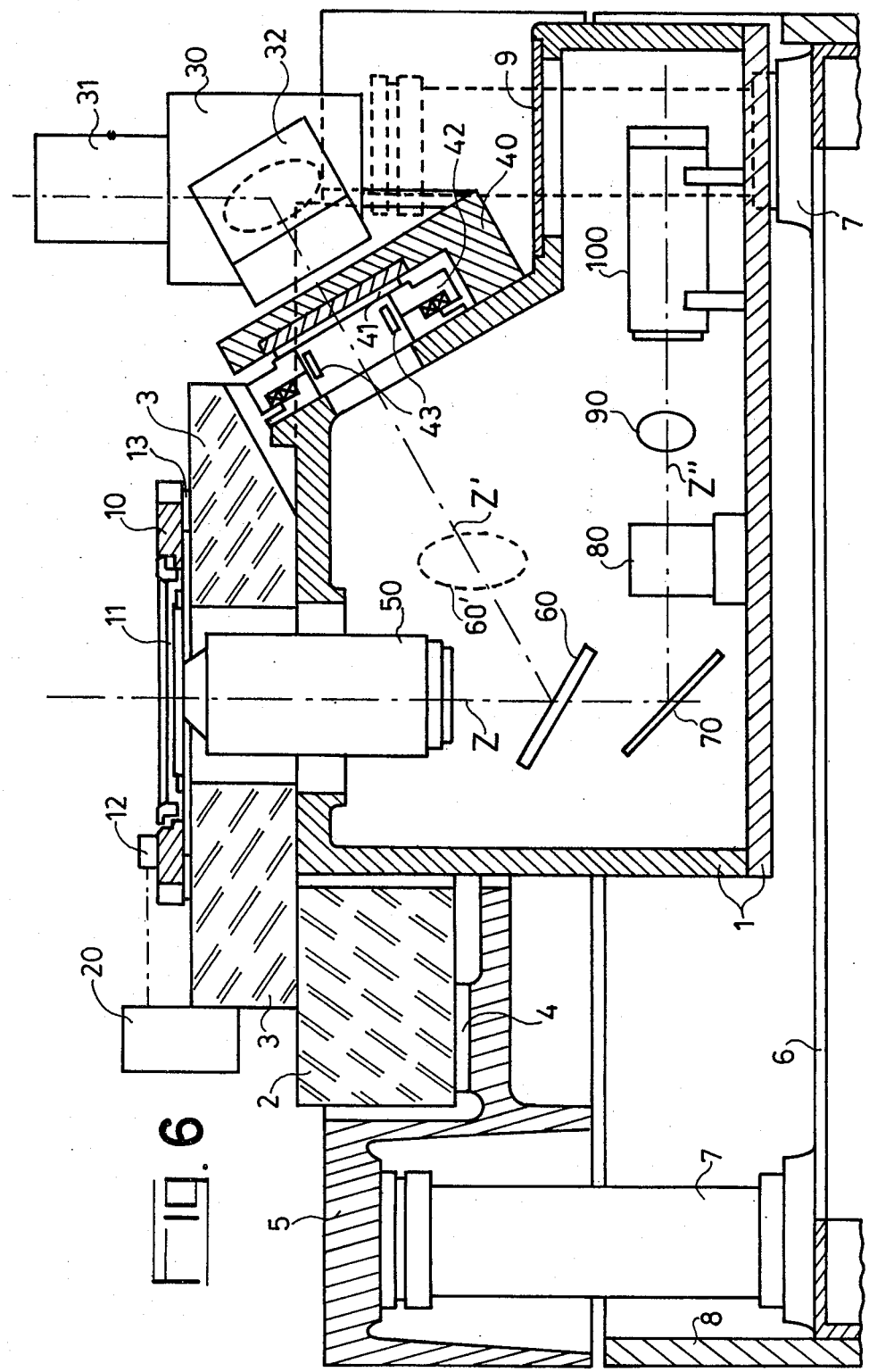

OPTICAL PROJECTION SYSTEM HAVING A PHOTOREPETITION FUNCTION

This invention relates to an optical system for the projection of patterns in order that the image of a modulating object carried by a reticle may be reproduced on a semiconductor wafer coated with photosensitive material for the fabrication of semiconductor components. The invention is directed in particular to an optical projection system in which it is possible to associate with the photorepetition function different functions such as photocomposition or a second photorepetition path, or to associate a device for alignment of object-image planes or alternatively any combinations of these functions.

In the optical projection systems of the prior art, photorepetition is performed by direct projection of the image of a modulating object on the semiconductor wafer to be exposed, a projection objective being employed for this purpose. A reducing objective is usually adopted and permits a reduction ratio of 1:5, for example. In certain applications, use is made of objectives having a long object-image distance such as 600 mm or more. These objectives result in photorepeaters of large size. Furthermore, photorepetition calls for a large number of complex operations, in particular operations involving alignment of the reticle with respect to the semiconductor wafer. Since it proves necessary to position these elements with a very high degree of accuracy, they usually have to be switched a considerable number of times and these operations have a tendency to slow-down the transfer process.

In order to overcome these drawbacks, the invention proposes to introduce one or a number of plane mirrors in the optical path of the projection objective of a photorepeater, said mirrors being either fixed or movable as requirements dictate. These arrangements make it possible to associated different functions such as photocomposition or a second photorepetition path with the photorepetition function without any switching operation other than simple withdrawal of a movable mirror. In another alternative embodiment which consists in making use of semitransparent fixed mirrors, a device for alignment of the object-image planes can be associated with the photorepetition function.

The invention offers a further advantage in that the optical beam can make a return-trip traversal by double reflection, thus permitting the use of objectives having a long object-image distance while maintaining compactness of the apparatus.

The invention also makes it possible to arrange the reticle (object) and the mask or the silicon wafer (image) so that the useful face is oriented in the same manner, namely directed downwards, for example, and if possible in the same plane, thus facilitating manipulations.

The invention is accordingly directed to an optical system for projecting patterns in order to reproduce the image of at least one modulating object on a semiconductor wafer coated with photosensitive material or on a mask. Said optical projection system comprises a projection objective as well as at least one source of light energy for the illumination of the modulating object, at least one first reticle and a second reticle each adapted to carry a modulating object. Provision is made for reflecting optical means comprising at least one movable plane mirror so arranged as to permit the formation of at least one first optical path and a second optical path in order that the image of said modulating objects carried by said first and second reticles may be projected alternately on said semiconductor wafer or on said mask by switching said movable mirror.

A more complete understanding of the invention will be gained from the following description in which further distinctive features will become apparent, reference being made to the accompanying drawings in which:

FIG. 5 is an extension of the alternative embodiment of FIG. 3;

FIG. 6 shows an example of practical construction of a photorepeater in which the invention has been carried into effect.

In the description which now follows with reference to FIGS. 1 to 5, the elements which are common to two or more figures are designated by the same references and will be described only once.

Figure 1:
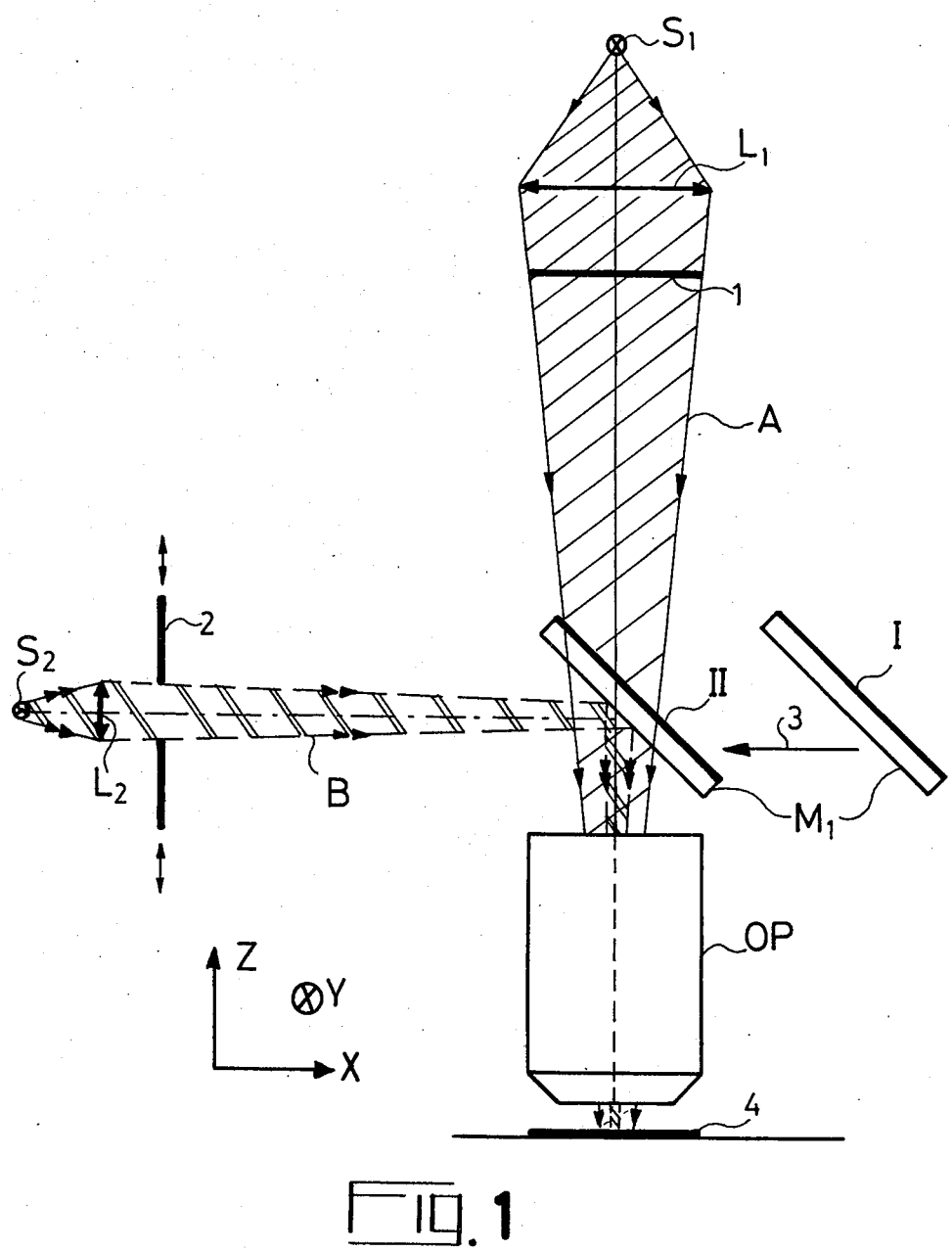
FIG. 1 illustrates a multifunction optical projection system according to the invention.
Figure 2:
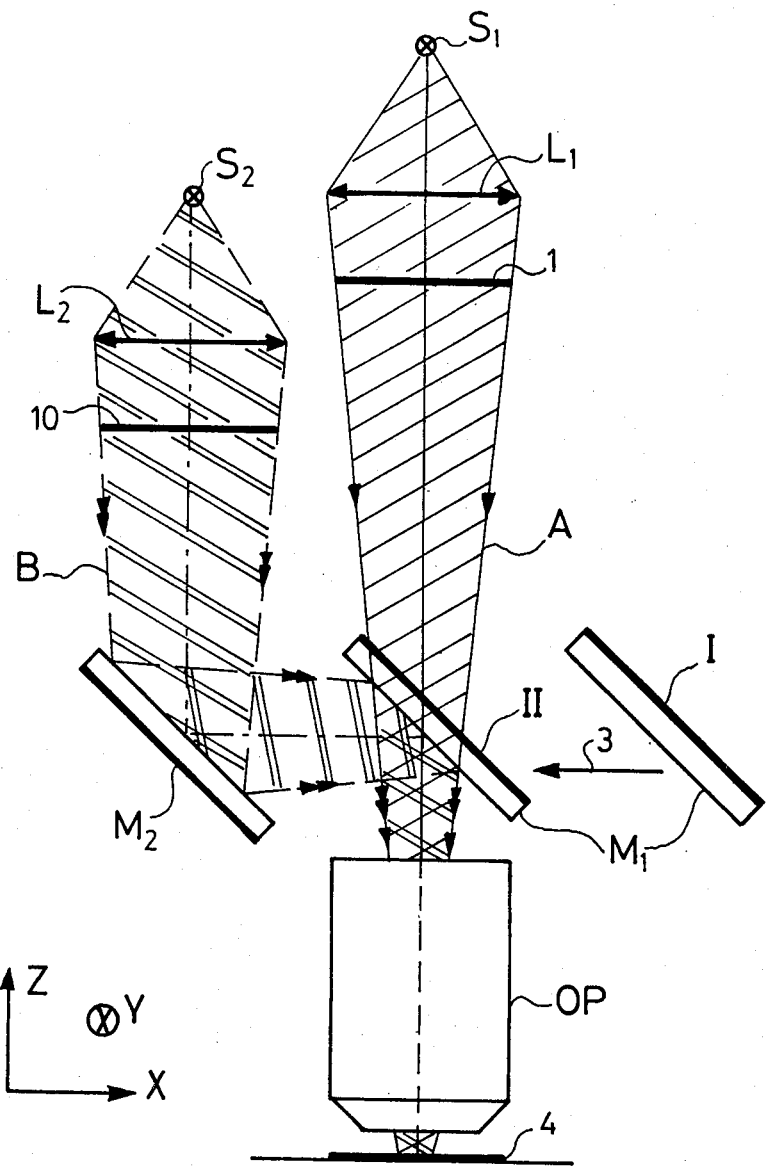
FIG. 2 illustrates a multipath optical projection system according to the invention.

FIGS. 1 and 2 are two exemplified embodiments of optical projection systems according to a first approach of the invention. These two embodiments each have two paths designated by the references A and B. The paths A and B can be identical photorepetition paths or separate paths. For example, path A can be a photorepetition path in which a reticle is employed, path B can be a photocomposition path in which a variable-opening slit is employed. Thus the optical projection system according to the invention can be employed either as a photorepeater or as a photocomposer or alternatively by associating the two functions in order to provide a mask on which are produced repeated images of the reticle and of the interconnections established by means of the variable-opening slit.

FIG. 1 shows one example of a multifunction optical projection system. A plane mirror $M_1$ is capable of displacement between two positions I and II. The optical projection system is constituted by the usual elements of a photorepeater of the prior art. In particular, a reticle 1 is illuminated by a source $S_1$ through a condenser $L_1$. The resultant beam A is projected by the projection objective OP on a semiconductor wafer 4 to be exposed for the fabrication of an integrated circuit or on a photosensitive plate for the formation of a mask when the mirror is in position I. The axis of the optical beam A is parallel to a reference axis Z. The optical projection system comprises a second path B which is represented as parallel to a reference axis X. A slit 2 having a variable opening along the axis Y is illuminated by a source $S_2$ through a condenser $L_2$. The resultant beam B will be intercepted by the mirror in position II and reflected along the optical axis of the objective OP (axis Z).

Positioning of the mirror $M_1$ must be accurate in order to ensure that the image projected on the semiconductor wafer 4 is of good quality. Typically, if a precision tolerance of 0.1 $\mu$m is desired on the wafer 4, positioning of the mirror must be reproducible with a precision of the order of 0.2 arc-second and 1 $\mu$m. These positioning reproducibilities are compatible with the use of the translational-motion tables which are available on the market such as, for example, a translational-motion table of the crossed-roller type. This table is shown diagrammatically in FIG. 1 and designated by the reference numeral 3. It is also possible to employ a turntable. When this requirement has been satisfied, the invention permits transition of the optical projection system from the photocomposition mode to the photorepetition mode simply as a result of switching of the mirror $M_1$. Instead of taking place along the axis X, switching can also take place along the axis Y.

FIG. 2 illustrates the principle of a multipath optical projection system. The general structure of the optical system is similar to that of FIG. 1. An additional plane mirror $M_2$ produces a double reflection of the beam B. The variable-opening slit has been replaced by a second reticle 10. By switching the mirror $M_1$ in the direction X, for example, the mask or the semiconductor wafer 4 can be exposed alternately to the image of the reticle 1 (the mirror $M_1$ being in position I) or to the image of the reticle 10 (the mirror $M_1$ being in position II).

In an alternative embodiment, path A can be employed for a photorepetition on a hard mask (photosensitive resin of the photoresist type). In this case, the source $S_1$ is a mercury vapor lamp associated with a filter (not shown) for selecting a particular line of the spectrum of the lamp. Channel B can be employed for a photorepetition on a mask of the high-resolution emulsion type (such as, for example, the "HRP" type manufactured by Kodak). The source $S_2$ in this case is a flash lamp.

The structures of FIGS. 1 and 2 can be reversed, for example by replacing the variable-opening slit 2 of FIG. 1 by a reticle. Furthermore, it is possible to employ an additional movable mirror, thus forming a third path.

Figure 3:
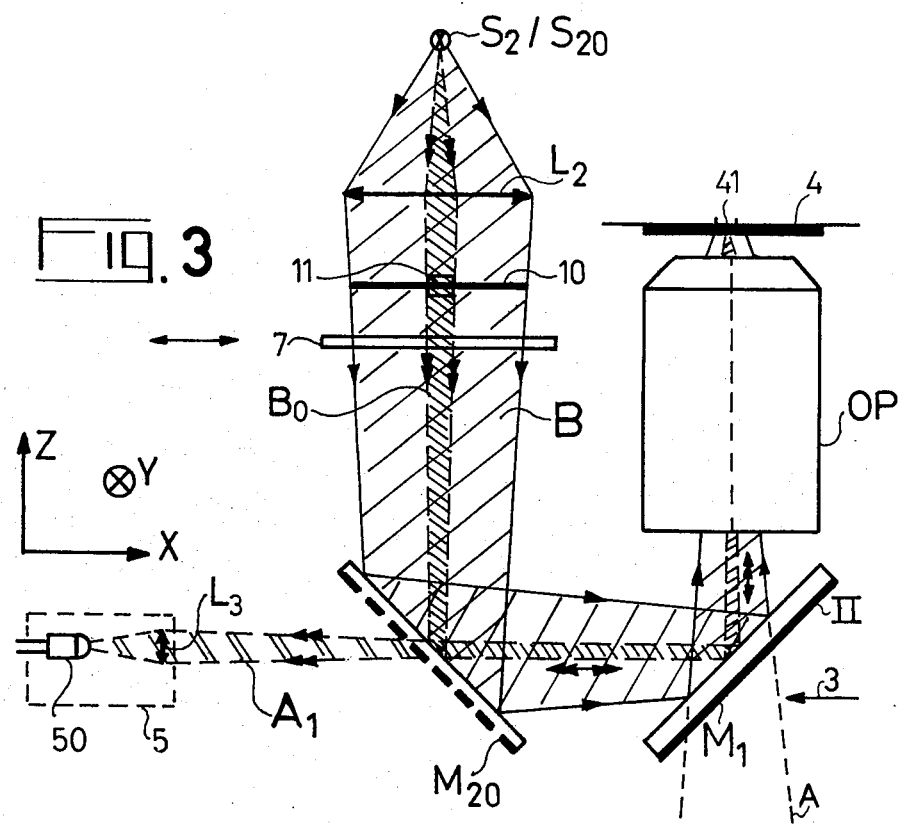
FIG. 3 is an alternative embodiment of the optical projection system of FIG. 2, this system being associated with an alignment device.

FIG. 3 is an alternative embodiment of the device of FIG. 2 in which a device is provided in addition for aligning the semiconductor wafer 4 with respect to the reticle 1. This device is shown only on path B. Path A (not shown) can also be associated with a device of this type. In a first operating step, the reticle 1 is illuminated by the source $S_2$, the resultant beam B is reflected initially by a fixed semitransparent plane mirror $M_{20}$ (equivalent to the mirror $M_2$ of FIG. 2 in the case of the path B) and a second time by the movable mirror $M_1$ (in position II) towards the objective OP. In addition to the patterns to be projected, the reticle has reference elements 11 in order to permit alignment.

Figure 4:
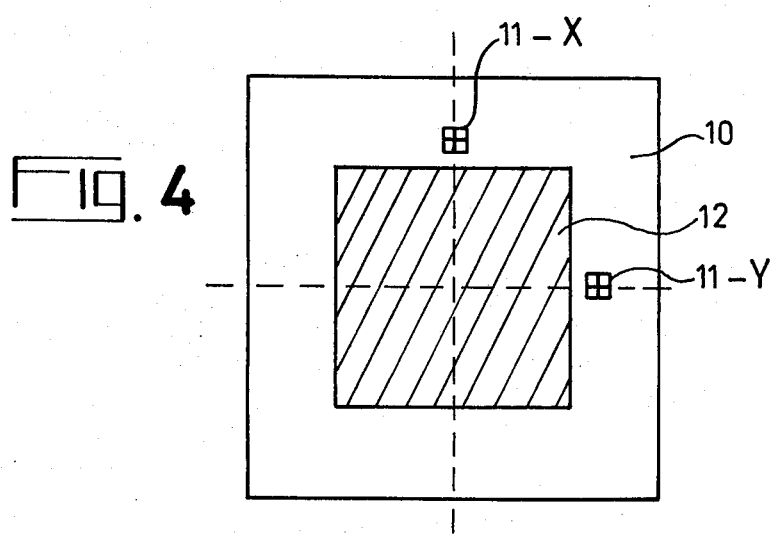
FIG. 4 illustrates the configuration of a recticle.

FIG. 4 illustrates one example of a reticle 10 of this type having a central zone constituted by the pattern 12 to be repeated. This reticle has a pair of reference elements 11-X, 11-Y for the purpose of alignment. Various methods of alignment have been proposed, and in particular the method of alignment described in French patent Application published under No. 2,388,371. By means of the two reference elements 11-X and 11-Y, the semiconductor wafer can be accurately positioned with respect to the axes X and Y and positioned angularly with respect to the axis Z.

During the alignment step, a source $S_{20}$ illuminates the reference elements 11-X and 11-Y and forms the beam $B_0$. The position of these reference elements is compared with that of a pair of reference elements 41 carried by the semiconductor wafer 4.

In order to carry out alignment, reverse traversal of the beam $B_0$ is employed. A portion $B_1$ of said beam will be transmitted by the semitransparent mirror $M_{20}$. The transmitted beam $B_1$ will be collected by a detector 5 comprising a focusing lens system $L_3$ and an optoelectronic component 50.

The source $S_{20}$ employed during the alignment step must have a wavelength which is different from the light energy source $S_2$ in order to ensure that an image is not produced on the photosensitive resin which covers the semiconductor wafer 4. To this end, it is possible by way of example to employ an He-Ne laser having an emission wavelength $\lambda_2 = 6328$ Å in the case of the source $S_2$ and a mercury vapor lamp fitted with a filter (not shown in FIG. 3) in the case of the source $S_2$. This makes it possible to select one line of the lamp spectrum corresponding to the highest sensitivity for exposure of the photosensitive resin such as, for example, $\lambda_1 = 4050$ Å. The objective OP is corrected for the wavelength $\lambda_1$. In order to obtain a sharp image on the semiconductor wafer, it is necessary to introduce optical focusing-correction means between the reticle and the objective OP during the stage of alignment in the optical path. The intended function of said optical means is to compensate for the difference in focusing which arises from the use of radiations of different wavelengths for exposure of the wafer and observation of the reference elements. The means referred-to can consist, for example, of a parallel transparent plate 7 of good optical quality ($\lambda/10$). The plate may be placed in any position in the plane XY; the only consideration of real importance is its angular position. Positioning and withdrawal of said plate can therefore be carried out rapidly.

In this embodiment, it is an advantage to ensure that the mirror $M_1$ has a multidielectric coating such that it provides maximum reflection (approx. 99%) of light energy of wavelength $\lambda_1$ (within the range 4050 Å to 4350 Å of exposure of the semiconductor wafer) and is semitransparent at the wavelength $\lambda_2$ (for example at the wavelength 6328 Å employed for alignment).

Although the sources $S_1$ and $S_2$ shown in FIG. 3 coincide, said sources may also be separate. The reference elements 11 of the reticle are usually placed at the periphery of the pattern to be projected. It is therefore possible to illuminate these reference elements by means of optical fibers, for example. This is illustrated in FIG. 5. Optical fibers 8 transport light energy from a laser $S_2$ to the reference elements 11. Only one reference element has been shown in FIG. 5.

The optical projection system of FIG. 5 (which represents an extension of the possibilities offered by the alternative embodiment of FIG. 3) also permits visualization, during the alignment stage, of the reference elements carried by the wafer 4. Since FIG. 5 is primarily intended to illustrate this aspect, the movable mirror $M_1$ has not been shown for reasons of convenience. This mirror can be placed between the mirror $M_{20}$ and the plate 7, for example. The alignment beam $B_0$ emerges from the reticle 1, is reflected from a semitransparent plane mirror $M_{20}$, reaches the projection objective OP and consequently projects the image of the reference element 11 on a reference element 41 carried by the semiconductor wafer 4. After reflection and reverse traversal of the light, part of said beam $B_0$ is transmitted at $B_1$. The beam $B_1$ is in turn reflected at $B_2$ from a second semitransparent mirror $M_{21}$ in order to be detected by optoelectronic detection means 5. The beam $B_2$ is in turn partly transmitted through the semitransparent mirror $M_{21}$. The image of one point of the reference element 41 is combined optically at 32 by means of a convergent lens $L_4$. A fixed plane mirror $M_3$ reflects the beam $B_3$ to a vidicon tube 6 through a lens $L_5$. The output signals of the vidicon tube can be transmitted to the electronic circuits of a television receiver (not shown in the drawings). An operator will be able to observe the superposition on a large screen, of the reference elements of the silicon wafer 4 and of the image of the reference elements carried by the reticle 1. The output signals of the detectors can be transmitted to control circuits which permit automatic alignment along two axes X and Y. If the movable mirror $M_1$ has been placed between the plate 7 and the mirror $M_{20}$, the detection means 5 and visualization means 6 can be common to the two paths A and B.

By way of non-limitative example, FIG. 6 describes a practical form of construction of a photorepeater in which the invention can be carried into effect, said photorepeater being associated with an alignment device. In this figure, only one of the paths (equivalent to the paths A or B described earlier) has been shown.

The photorepeater shown in FIG. 6 comprises a lower frame structure 8 and an upper frame structure 5. The upper structure 5 rests on a base plate 6 which is rigidly fixed to the lower structure 8 by means of air-damping columns 7. The upper frame structure 5 is adapted to support a precision-machined bearing block 2 by means of a damping shoe 4. Said bearing block 2 constitutes a base for a reference surface plate 3 and is also adapted to carry an XY-translation table (not shown in detail). The reference surface plate 3 is in turn adapted to carry a correcting table 10 which is displaceable along two orthogonal axes X and Y. The amplitude of these movements of displacement is of the order of ten microns with respect to the XY table. These movements are controlled by two sets of piezoelectric ceramic elements which produce action respectively along the axes X and Y. Said movements of displacement all take place under the control of two cross-motion interferometer units. Only the interferometer 20 and the mirror 12 for measurement along the axis X have been shown. This method is in the field of the known art and the control circuits are not shown in FIG. 1. An optical system 1 is secured to the reference surface plate 3. The different components of this optical system 1 are, in particular, a projection objective 50 and at least one reticle mounting 42. Said mounting 42 is a reticle-switching element on which the reticle 41 is fixed. An XY and $\theta$ manipulator 40 serves to align the reticle 41 with respect to setting markers 43. The semiconductor wafer 11 coated with a layer of photosensitive resin to be exposed is placed on the correcting plate 10. Said correcting plate is capable of sliding motion on air cushions 13 in the plane of the reference surface plate. The projection objective 50 is capable of displacement along the axis Z. Said objective is provided with all the conventional adjusting elements (which are not shown in FIG. 1). The reticle 41 is capable of displacement along two orthogonal axes X and Y and in rotation $\theta$ in the plane defined by X and Y. The patterns to be projected on the silicon wafer 11 as well as reference patterns are inscribed on said reticle. The optical system 1 as constructed according to the invention comprises a semitransparent mirror 60, a second mirror 70 and a compensating optical system 80, alignment-detecting means 90 and a vidicon tube 100. The optical system further comprises an access window 9 and an illuminating unit 30 comprising a condenser and a mirror 32 as well as a source 31 of light energy. A third movable mirror 60' which may be associated with other fixed mirrors (not shown) can be placed on the axis Z', for example, in order to form a second path. Said mirror 60' serves on the one hand to occult the beam emerging from the reticle mounting 42 and on the other hand to reflect and project towards the objective 50, via the mirror 60, the beam issuing from another objectiveholder or from a variable-opening slit as described with reference to FIGS. 1 and 2.

The invention is not limited to the embodiments described in the foregoing. It is possible in particular to combine the embodiment of FIG. 5 with one of FIGS. 1 or 2. There is accordingly obtained a multifunction and/or multipath optical projection system associated with an alignment device. In spite of the wide range of different possibilities, this apparatus is designed in an extremely compact form.

The optical reflecting means comprising mirrors according to the invention therefore have a threefold function:

they permit bending-back of the optical path and are conducive to an optical projection system of compact design even with object-image distances of 1 meter;

they make it possible to place the reticle and the semiconductor wafer either in a horizontal plane or in an inclined plane, this possibility being conducive to simple manipulations;

finally, they permit the construction of an optical projection system in which a plurality of functions and/or a plurality of paths are combined without entailing any need for complex manipulations or a large number of difficult element-switching operations. Moreover, an automatic alignment device equipped with a simultaneous visualization system may be simply associated with the optical projection system.

The principle characteristics of the elements which are necessary for practical application of the invention as well as a few non-limitative examples of commercially available elements are indicated in the table given hereunder:

projection objective... make known as CERCO, reference 744, reduction ratio 1:5 illuminating source for alignment ... He-Ne laser $\lambda_2 = 6328$ Å illuminating source for projection ... broad-spectrum mercury-vapor lamp associated with filters for selecting the line $\lambda_1 = 4050$ Å optoelectronic detection means ... photodiodes: make known as EGG, type SGD 100 or HAD 1000A or photomultiplier, make known as R.T.C., type XP 1117 (miniphotomultiplier)

fixed or movable mirrors ... surface flatness: at least $\lambda/10$ monolayer or multilayer treatment in order to prevent any variation in coefficient of reflection semitransparent plane mirrors ... multidielectric mirror:

coefficient of reflection 0.99 within the range: 4050 Å $< \lambda_1 <$ 4350 Å coefficient of transmission of approx. 0.5 in respect of $\lambda = 6328$ Å reflection alone is employed for the imagery (in order to prevent aberrations)

surface treatment and flatness identical with the fixed plane mirrors.

The other components (lenses and so forth) are selected from those usually employed for photorepeaters of the known art.

What is claimed is:

1. An optical system for projecting patterns in order to reproduce the image of at least one modulating object on a semiconductor wafer coated with photo-sensitive material or on a mask, said optical system being provided with a projection objective and with at least one source of light energy for the illumination of the modulating object, wherein said projection system comprises at least one first reticle and a second reticle each adapted to carry a modulating object, and reflecting optical means comprising at least one movable plane mirror adapted to permit the formation of at least one first optical path and a second optical path in order that the image of said modulating objects carried by said first and second reticles may be projected alternately on said semiconductor wafer or on said mask by switching said movable mirror.

2. A system according to claim 1, comprising at least one reticle and a variable-opening slit adapted to permit a pre-established sequence of operation in photocomposition and in photorepetition, respectively by alternate projection of the image of said variable-opening slit or of the image of a modulating object carried by said reticle, said alternate projection being performed by switching said movable mirror.

3. A system according to claim 1, wherein said movable plane mirror is rigidly fixed to a translationalmotion table or to a turntable.

4. A system according to claim 1, wherein said system further comprises a device for carrying out alignment by optical association of reference elements carried by said reticle with reference elements carried by the semiconductor wafer, wherein said alignment device comprises a first light-energy source having a first emission wavelength and activated during exposure stages and a second source having a second emission wavelength and activated during alignment stages, and wherein said reflecting optical means further comprise at least a first partially transparent fixed plane mirror associated with one of said optical paths in order that the light beams of first and second wavelength produced by said first and second sources may be reflected to said projection objective and that the light beam having said second wavelength may be selectively transmitted to optoelectronic detection means during return traversal of the light.

5. A system according to claim 4, wherein said first partially transparent fixed plane mirror is provided with a multidielectric coating in order that said mirror may have a coefficient of reflection in the vicinity of 1 in respect of said first wavelength and a coefficient of transmission in the vicinity of 0.5 in respect of said second wavelength.

6. A system according to claim 4, wherein said optical reflecting means comprise at least one second partially transparent fixed plane mirror associated with one of said optical paths, said mirror being adapted to reflect part of the light energy transmitted by said first partially transparent plane mirror to said optoelectronic detection means and to transmit another part of said light energy to visualization means.

7. A system according to claim 6, wherein said visualization means comprise a television camera.

8. A system according to claim 4, wherein the objective is corrected for said first wavelength and comprises focusing-correction means adapted to compensate for the difference in focusing and magnification arising from the use of two radiations of different wavelength.

9. A system according to claim 4 or claim 6, wherein said optoelectronic means and said visualization means are common to a number of said optical paths.

* * * * *